United States Patent
Cho et al.

(10) Patent No.: US 9,412,900 B2
(45) Date of Patent: Aug. 9, 2016

(54) GREEN-LIGHT EMITTING DEVICE INCLUDING QUATERNARY QUANTUM WELL ON VICINAL C-PLANE

(71) Applicant: Samsung Electronics Co., Ltd., Suwon-si, Gyeonggi-do (KR)

(72) Inventors: Yong-Hee Cho, Seoul (KR); Sungjin Kim, Suwon-si (KR); Munbo Shim, Yongin-si (KR); Yukeun Eugene Pak, Seongnam-si (KR)

(73) Assignees: AICT (Advanced Institutes of Convergence Technology), Gyeonggi-do (KR); Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/603,103

(22) Filed: Jan. 22, 2015

(65) Prior Publication Data
US 2016/0056328 A1    Feb. 25, 2016

(30) Foreign Application Priority Data
Aug. 21, 2014    (KR) .................. 10-2014-0109044

(51) Int. Cl.
*H01L 33/00*    (2010.01)
*H01L 33/06*    (2010.01)
*H01L 33/32*    (2010.01)
*H01L 33/16*    (2010.01)

(52) U.S. Cl.
CPC ............ *H01L 33/06* (2013.01); *H01L 33/0025* (2013.01); *H01L 33/16* (2013.01); *H01L 33/32* (2013.01)

(58) Field of Classification Search
CPC ..... H01L 33/06; H01L 33/0025; H01L 33/16; H01L 33/32
See application file for complete search history.

(56) References Cited

U.S. PATENT DOCUMENTS 6,219,365 B1    4/2001    Mawst et al.
6,693,941 B1 *  2/2004    Okazaki et al. ................. 372/75
(Continued)

FOREIGN PATENT DOCUMENTS

| JP | 2004095827 A | 3/2004 |
| KR | 101122184 B1 | 3/2012 |
| KR | 20130018069 A | 2/2013 |

OTHER PUBLICATIONS

Huang, Hsin-Hsiung, et al., "Triangular Extended Microtunnels in GaN Prepared by Selective Crystallographic We Chemical Etching", Journal of the Electrochemical Society, 155 (7) pp. H504-H-507 (2008).

(Continued)

*Primary Examiner* — Nikolay Yushin
(74) *Attorney, Agent, or Firm* — Harness, Dickey & Pierce, P.L.C.

(57) ABSTRACT

Example embodiments relate to a green-light emitting device including a quaternary quantum well on a vicinal c-plane. The light-emitting device includes a substrate having a vicinal c-plane surface and a light-emitting layer on the vicinal c-plane surface of the substrate. The light-emitting layer includes a quantum well layer of $Al_xIn_yGa_{1-x-y}N$ and quantum barrier layers of $In_zGa_{1-z}N$ disposed on and under the quantum well layer respectively, and $0<x<1$, $0<y<1$, and $0<z<1$.

7 Claims, 4 Drawing Sheets

(56) References Cited

U.S. PATENT DOCUMENTS

| | | | | |
|---|---|---|---|---|
| 6,743,702 | B2* | 6/2004 | Goto | H01S 5/0425 257/E21.172 |
| 7,118,813 | B2* | 10/2006 | Xu | C30B 25/18 117/101 |
| 7,804,019 | B2* | 9/2010 | Pierce et al. | 136/200 |
| 7,884,447 | B2 | 2/2011 | Brandes et al. | |
| 7,952,109 | B2* | 5/2011 | Ng | 257/94 |
| 8,110,482 | B2 | 2/2012 | Kaeding et al. | |
| 8,212,259 | B2* | 7/2012 | Flynn et al. | 257/76 |
| 8,421,057 | B2* | 4/2013 | Yan et al. | 257/13 |
| 2002/0146855 | A1* | 10/2002 | Goto | H01S 5/0425 438/29 |
| 2007/0051962 | A1* | 3/2007 | Lai | H01L 33/08 257/94 |
| 2011/0315952 | A1* | 12/2011 | Yan et al. | 257/13 |
| 2012/0100650 | A1* | 4/2012 | Speck et al. | 438/31 |

OTHER PUBLICATIONS

Yamaguchi, Atsushi A, "Theoretical investigation of optical polarization properties in Al-rich AlGaN quantum wells with various substrate orientations", Applied Physics Letter 96, pp. 151911-1-151911-3 (2010).

Qi, S. L., et al., "Study on the formation of dodecagonal pyramid on nitrogen polar GaN surface etched by hot H3PO4", Applied Physics Letter 95, 071114-1-071114-3 (2009).

Park, Seoung-Hwan, et al., "Spontaneous emission and optical gain characteristics of blue InGaAlN/InGaN quantum well structures with reduced internal field", Journal of Applied Physics 112, 043107-1-043107-5 (2012).

Schubert, Martin, et al., "Polarization-matched GaInN AlGaInN multi-quantum-well light-emitting diodes with reduced efficiency droop", Applied Physics Letter 93, 041102-1-041102-3 (2008).

Kyono, Takashi, et al., "Optical Polarization Characteristics of InGaN Quantum Wells for Green Laser Diodes on Semi-Polar {2021} GaN Substrates", Applied Physics Express 3, pp. 011003-1-011003-3, (2010).

Park, Seoung-Hwan, et al., "Optical gain in InGaN InGaAlN quantum well structures with zero internal field", Applied Physics Letters 92, 171115-1-171115-3, (2008).

Drude, Paul, "Nitride semiconductors free of electrostatic fields for efficient white light-emitting diodes", Letters to Nature, Nature, vol. 406, Aug. 24, 2000, pp. 865-868.

Yamamoto, Shuichiro, High-Efficiency Single-Quantum-Well Green and Yellow-Green Light-Emitting Diodes on Semipolar (2021) GaN Substrates, Applied Physics Express 3 (2010, pp. 122102-1-122102-3.

Lin, You-Da, et al., "High Quality InGaN AlGaN Multiple Quantum Wells for Semipolar InGaN Green Laser Diodes", Applied Physics Express 3 (2010), pp. 082001-1-082001-3.

Zhao, Yuji, et al., "High Power Blue Violet Semipolar (2021) InGaN/GaN Light-Emitting Diodes with Low Efficiency Droop at 200 A/cm2", Applied Physics Express 4 (2011) pp. 082104-1-082104-3.

Peter, M., et al., "Green ThinGaN power-LED", Phys. Stat. Sol. (c) 5, No. 6, pp. 2050-2052 (2008)/DOI 10.1002/pssc.200778554.

Nishizuka, K., et al., "Efficient rainbow color luminescence from InxGa1-xN single quantum wells fabricated on {1122} microfacets", Applied Physics Letters 87, 231901 (2005).

Park, Seoung-Hwan, "Crystal orientation effects on electronic properties of wurtzite InGaN/GaN quantum wells", Journal of Applied Physics, vol. 91, No. 12, Jun. 15, 2002, pp. 9904-9908.

Bejtka, K., "Composition and luminescence of AlInGaN layers grown by plasma-assisted molecular beam epitaxy", Journal of Applied Physics 104, 073537 (2008), pp. 073537-1-073537-6.

Funato, Mitsuru, et al., "Blue, Green, and Amber InGaN/GaN Light-Emitting Diodes on Semipolar {1122} GaN Bulk Substrates", Japanese Journal of Applied Physics, vol. 45, No. 26, pp. L659-L662.

"Compound Semiconductor, Connecting The Compound Semiconductor Community", Jan./Feb. 2013, vol. 19, No. 1.

Enya, Yohei, et al., "531 nm Green Lasing of InGaN Based Laser Diodes on Semi-Polar {2021} Free-Standing GaN Substrates", Applied Physics Express 2 (2009) 082101, pp. 082101-1-082101-3.

Zhao, Yuji, et al., "30-mW-Class High-Power and High Efficiency Blue Semipolar (1011) InGaN/GaN Light-Emitting Diodes Obtained by Backside Roughening Technique", Applied Physics Express 3 (2010) 102101, pp. 102101-1102101-3.

Nishizuka, K. et al., "Efficient radiative recombination from <1122>-oriented INxGa1-xN multiple quantum wells fabricated by the regrowth technique," Applied Physics Letters, vol. 85, No. 15, Oct. 11, 2004, pp. 3122-3124.

Vurgaftman, I. et al., "Band parameters for nitrogen-containing semiconductors," Journal of Applied Physics, vol. 94, No. 6, Sep. 15, 2003, pp. 3675-3696.

Suzuki, Teruaki et al., "Reverse-rotational domains in in-plane switching-mode liquid crystal displays," Journal of Applied Physics, vol. 89, No. 1, Jan. 1, 2001, pp. 1-4.

Wächter, Clemens et al., "High wavelength tunability of InGaN quantum wells grown on semipolar GaN pyramid facets," Physica Status Solidi B, vol. 248, No. 3, 2011, pp. 605-610.

* cited by examiner

GREEN-LIGHT EMITTING DEVICE INCLUDING QUATERNARY QUANTUM WELL ON VICINAL C-PLANE

RELATED APPLICATION

This application claims priority from Korean Patent Application No. 10-2014-0109044, filed on Aug. 21, 2014, in the Korean Intellectual Property Office, the disclosure of which is incorporated herein in its entirety by reference.

BACKGROUND

1. Field

Example embodiments relate to a green light-emitting device including a quaternary quantum well on a vicinal c-plane.

2. Description of the Related Art

A light-emitting device including a light-emitting layer formed of a Group-III nitride material such as GaN, AlN, InN, or the like emits bright light from an infrared light wavelength spectrum to green light wavelength spectrum. However, in such a light-emitting device, an internal electric field is typically formed, which is caused by a spontaneous polarization field depending on a direction of a crystallographic axis and a polarization field induced by strain generated due to a lattice constant difference with a substrate. The spontaneous polarization field is generally strongest when the direction of the crystallographic axis is <0001> (that is, a polar direction), and the strength of the spontaneous polarization field decreases in a non-polar direction (that is, an m-plane). As electrons and holes are spatially separated due to the internal electric field, a light-emission coupling rate decreases, thus degrading the performance of the light-emitting device. In particular, an InGaN-based quantum well light-emitting device has low light-emission efficiency with respect to a green wavelength.

To reduce the internal electric field, a light-emitting layer may be grown in a non-polar direction or semi-polar direction of a growth substrate. In addition, a miscut substrate may be used to reduce the internal electric field.

SUMMARY

Example embodiments relate to a light-emitting device including a quaternary quantum grown on a vicinal c-plane to improve a light-emitting efficiency of green light.

Additional example embodiments will be set forth in part in the description which follows and, in part, will be apparent from the description, or may be learned by practice of the example embodiments.

According to at least one example embodiment, a light-emitting device includes a substrate having a vicinal c-plane surface and a light-emitting layer on the vicinal c-plane surface of the substrate, in which the light-emitting layer comprises a quantum well layer of $Al_xIn_yGa_{1-x-y}N$ and quantum barrier layers of $In_zGa_{1-z}N$ disposed on and under the quantum well layer respectively, and wherein $0<x<1$, $0<y<1$, and $0<z<1$.

The substrate may be inclined in a range from about 10° to about 40° with respect to a c-axis.

Compositions x, y, and z may be values that allow an internal electric field of the light-emitting device to be equal to 0 or to be close to 0.

The composition x may be in a range from about 0.1 to about 0.4, the composition y may be in a range from about 0.3 to 0.5, and the composition z may be in a range from about 0.25 to 0.35.

The light-emitting device may include a green-light emitting device.

The substrate may include a silicon substrate and may have a wurtzite structure.

The substrate may include sapphire, GaN, SiC, AlN or BN.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
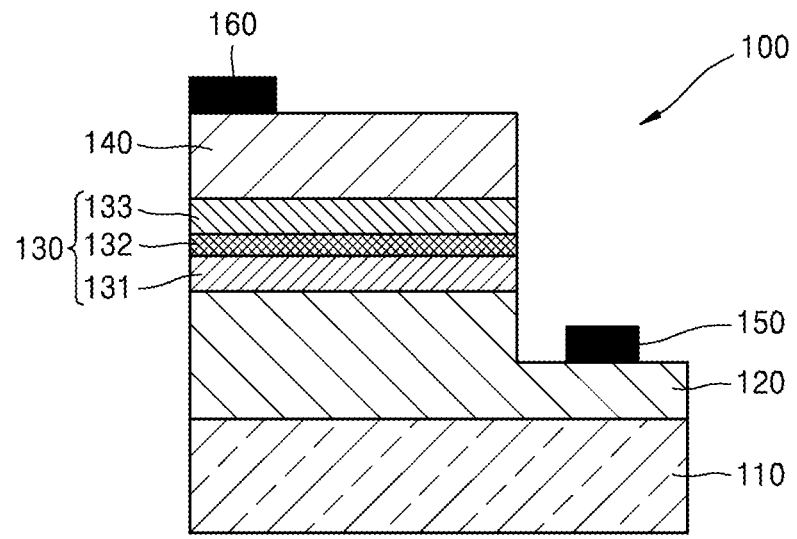
FIG. 1 is a cross-sectional view schematically illustrating a structure of a green light-emitting device including a quaternary quantum well on a vicinal c-plane, according to an example embodiment.

Reference will now be made in detail to example embodiments illustrated in the accompanying drawings. Thicknesses of layers or regions shown in the drawings are exaggerated for clarity. The example embodiments may have different forms and should not be construed as being limited to the descriptions set forth herein. Accordingly, the example embodiments are merely described below, by referring to the figures, to explain examples of the present description. It will be understood that when an element or layer is referred to as being "on" another element or layer, the element or layer can be directly on another element or layer or intervening elements or layers. Like reference numerals are used for like elements having substantially the same functions, and redundant detailed descriptions thereof will not be repeated. As used herein, the term "and/or" includes any and all combinations of one or more of the associated listed items. Expressions such as "at least one of," when preceding a list of elements, modify the entire list of elements and do not modify the individual elements of the list. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

FIG. 1 is a cross-sectional view schematically illustrating a structure of a green light-emitting device 100 including a quaternary quantum well on a vicinal c-plane, according to an example embodiment.

Referring to FIG. 1, an n-type nitride semiconductor layer 120, a light-emitting layer 130, and a p-type nitride semiconductor layer 140 are formed, for example sequentially formed, on a substrate 110. The n-type nitride semiconductor layer 120 is exposed by the light-emitting layer 130, and an n-type electrode 150 is formed on the exposed region of the n-type semiconductor layer 120. A p-type electrode 160 is formed on the p-type nitride semiconductor layer 140. The light-emitting layer 130 may include two quantum barrier layers 131 and 133 and a quantum well layer 132 therebetween. That is, the light-emitting layer 130 may include a single quantum well structure. The light-emitting layer 130 may also have a multi-quantum well structure having a plurality of quantum barrier layers 131 and 133 and a plurality of quantum well layers 132 formed therebetween.

The substrate 110 may be formed of or include a material having a wurtzite crystal structure. For example, the substrate 110 may be formed of or include sapphire, SiC, GaN, AlN, BN, or the like. The substrate 110 may be used to grow a nitride semiconductor layer thereon. The substrate 110 may have an axis inclined at a first angle with respect to a c-axis.

Figure 2:
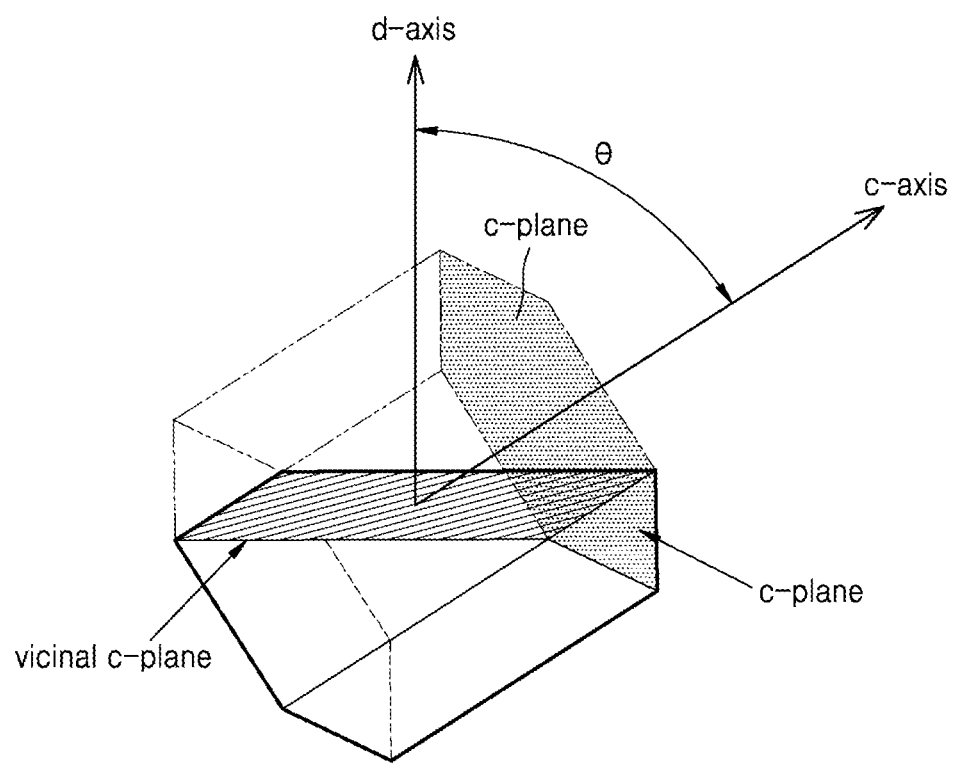
FIG. 2 schematically illustrates a structure of a miscut substrate according to an example embodiment.

FIG. 2 schematically illustrates a structure of a miscut substrate, according to an example embodiment;

Referring to FIG. 2, the substrate 110 has a wurtzite crystal structure that is an example of a hexagonal structure. A top surface of the substrate 110 may include a vicinal c-plane surface that is substantially perpendicular to an axis (d-axis) that is inclined at a first angle θ with respect to the c-axis. Material layers on the substrate 110 are grown in the direction of the d-axis. The first angle θ may be about 10°-40°. If the first angle θ is less than about 10°, light emitted from the light-emitting device may be blue. If the first angle θ is greater than about 40°, yellow light may be emitted from the light-emitting device and a small quantity of blue light may be also emitted.

The n-type semiconductor layer may be formed of or include n-AlGaN (n-doped AlGaN) or n-GaN (n-doped GaN). The n-type semiconductor layer may include Group-IV elements, for example, Si, Ge, Se, or Te impurities. The n-type nitride semiconductor layer 120 may be formed on the substrate 110 using, for example, metal-organic chemical vapor deposition (MOCVD), hydride vapor phase epitaxy (HVPE), or molecular beam epitaxy (MBE).

A buffer layer (not shown) may be further formed between the substrate 110 and the n-type nitride semiconductor layer 120. In FIG. 1, the buffer layer is not illustrated for convenience. The buffer layer may be formed to alleviate lattice mismatch between the substrate 110 and the n-type nitride semiconductor layer 120. The buffer layer may be a single layer formed of or including AlN or GaN. The buffer layer may be formed of or include super-lattice layers of AlGaN/AlN.

The example embodiment is not limited to the above. For example, the substrate 110 may be formed by miscutting a silicon substrate at an angle of about 10°-40° and forming the buffer layer on the miscut substrate.

A portion of a top surface of the n-type nitride semiconductor layer 120 may be partially etched. The n-type electrode 150 may be formed on the etched portion of the n-type nitride semiconductor layer 120.

Example embodiments are not limited thereto. For example, the n-type nitride semiconductor layer 120 may have a flat top surface, the light-emitting layer 130 may be formed on a region of the n-type nitride semiconductor layer 120, and the n-type electrode 150 may be spaced apart from the light-emitting layer 130 on the n-type nitride semiconductor layer 120.

The light-emitting layer 130 may emit green light having an energy of about 2 eV-2.5 eV based on re-coupling between electrons and holes. The light-emitting layer 130 may have a structure in which a quantum well layer 132 and the quantum barrier layers 131 and 133 are alternatively stacked at least once. The quantum well layer 132 may have a single quantum well structure or a multi-quantum well structure. The light-emitting layer 130 may be formed using MOCVD, HVPE, or MBE. In FIG. 1, a single quantum well structure is illustrated for convenience.

The quantum well layer 132 of the light-emitting layer 130 may have a quaternary structure of $Al_xIn_yGa_{1-x-y}N$. The quantum barrier layers 131 and 133 of the light-emitting layer 130 may be formed of or include a material having a larger band gap than the quantum well layer 132. The quantum barrier layers 131 and 133 may have a ternary structure of $In_zGa_{1-z}N$. Composition ratios x, y, and z of the quantum well layer 132 and the quantum barrier layers 131 and 133 may be set to values that allow an internal electric field of the light-emitting device to be equal to 0 or to be close to 0. For example, x may be about 0.1-0.4, y may be about 0.3-0.5, and z may be about 0.25-0.35.

The p-type nitride semiconductor layer 140 may include impurities formed of or including Group-II elements, which are p-type impurities. For example, the p-type nitride semiconductor layer 140 may include Mg, Zn, or Be impurities. The p-type nitride semiconductor layer 140 may be formed using, for example, MOCVD, HVPE, or MBE.

The p-type electrode 160 may be formed on the p-type nitride semiconductor layer 140. The p-type electrode 160 may be formed on a region of the top surface of the p-type nitride semiconductor layer 140.

The n-type electrode 150 and the p-type electrode 160 may be formed of or include common metallic materials that will not be described in detail herein.

Figure 3:
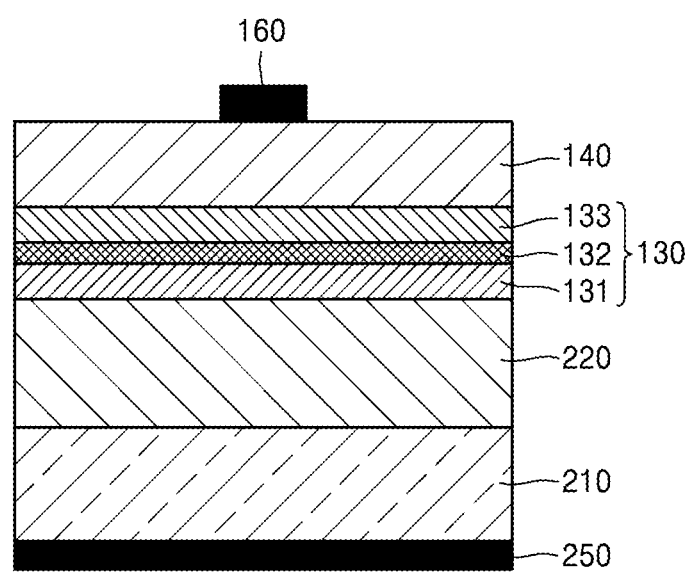
FIG. 3 is a cross-sectional view schematically illustrating a structure of a green light-emitting device including a quaternary quantum well on a vicinal c-plane, according to another example embodiment.

FIG. 3 is a cross-sectional view schematically illustrating a structure of a green-light emitting device 200 including a quaternary quantum well on a vicinal c-plane, according to another example embodiment. Components that are substantially the same as those of the structure illustrated in FIG. 1 will be referred to using the same reference numerals as used in FIG. 1 and will not be described in detail here.

Referring to FIG. 3, an n-type nitride semiconductor layer 220, the light-emitting layer 130, and the p-type nitride semiconductor layer 140 are formed, for example sequentially formed, on a substrate 210. An n-type electrode 250 may be formed under the substrate 210. The p-type electrode 160 may be formed on the p-type nitride semiconductor layer 140. The light-emitting layer 130 may include two quantum barrier layers 131 and 133 and the quantum well layer 132 therebetween. That is, the light-emitting layer 130 may include a single quantum well structure. The light-emitting layer 130 may also have a multi-quantum well structure including a plurality of quantum barrier layers 131 and 133 and a plurality of quantum well layers 132 formed therebetween.

The substrate 210 may be formed of or include a material having a wurtzite crystal structure, and a conductive material. For example, the substrate 210 may include n-type GaN, n-type AlN, or n-type BN. The substrate 210 may include Si, Ge, Se, or Te impurities as impurities.

The substrate 210 may be used to grow a nitride semiconductor layer thereon. The substrate 210 may include a surface that is substantially perpendicular to the axis (d-axis) inclined at the first angle θ with respect to the c-axis. Material layers on the substrate 210 may be grown in the direction of the d-axis. The first angle θ may be about 10°-40°. If the first angle θ is less than about 10°, light emitted from the light-emitting device is blue, and if the first angle θ is greater than about 40°, light emitted from the light-emitting device may be yellow.

Example embodiments are not limited to the above. For example, the substrate 210 may be used by miscutting a silicon substrate at an angle of about 10°-40° and forming a buffer layer on the miscut substrate.

The n-type nitride semiconductor layer 220 may have a flat top surface. The n-type nitride semiconductor layer may be omitted.

Another substrate, for example, a sapphire substrate may be used, and an n-type nitride semiconductor layer on the another substrate may be miscut.

Example embodiments are not limited thereto. For example, a nitride semiconductor stack structure including a first substrate having the vicinal c-plane illustrated in FIG. 1 as a growth substrate of a nitride layer may be formed, and the n-type nitride semiconductor layer 220 may be formed on the first substrate, and then the first substrate may be removed.

Other component materials may be known from the foregoing example embodiment, and thus will not be described in detail here.

Figure 4:
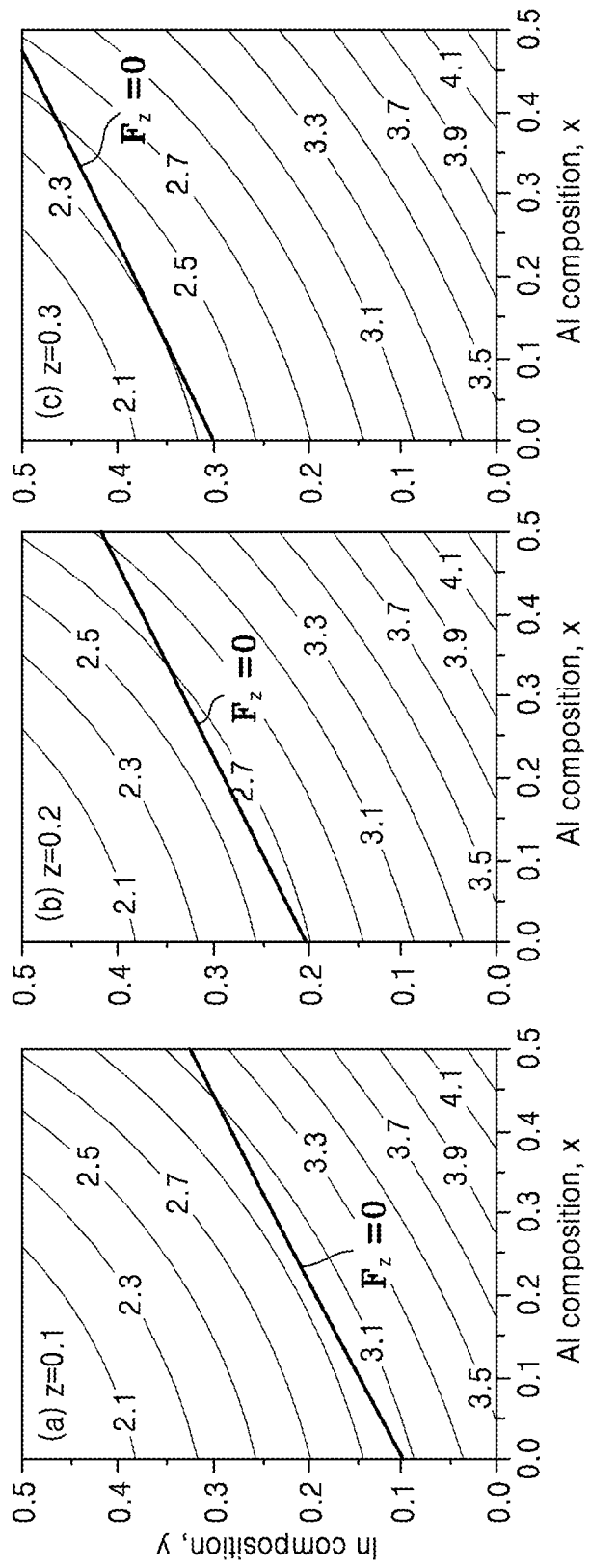
FIG. 4 is a graph showing a band gap corresponding to a quantum well layer composition of a light-emitting device, according to an example embodiment.

FIG. 4 is a graph showing a band gap corresponding to a AlxInyGa1-x-yN quantum well layer composition of a light-emitting device according to an example embodiment. A simulation was performed of a light-emitting device having a single quantum well layer structure, in which the thickness of the quantum well layer 132 was about 3 nm and the first angle θ of the vicinal c-plane was about 20°. In the graph, the X-axis plots an x value of the quantum well layer and the Y-axis plots a y value of the quantum well layer.

In FIG. 4(a), z=0.1 and a band gap changes with the x and y values. According to changes in composition x and y of the light-emitting layer, a line exists in which an internal electric field Fz is 0. However, the Fz line falls beyond a band gap range of green light, 2 eV-2.5 eV. That is, when the first angle θ is 20° and z=0.1, the light-emitting device fails to emit green light.

In FIG. 4(b), z=0.2 and a band gap changes with the x and y values. According to changes in the composition x and y of the light-emitting layer, a line exists in which the internal electric field Fz is 0. The Fz line is close to the band gap range of green light, 2 eV-2.5 eV. That is, when the first angle θ is 20° and z=0.2, the light-emitting device may emit light close to green light.

In FIG. 4(c), z=0.3 and a band gap changes with the x and y values. According to changes in the composition x and y of the light-emitting layer, a line exists in which the internal electric field Fz is 0. The Fz line falls within the band gap range of green light, 2 eV-2.5 eV. That is, when the first angle θ is 20° and z=0.3, the light-emitting device emits green light in a range of x of 0-0.4 and a range of y of 0.28-0.45.

As the internal electric field becomes 0 or is reduced, electrons and holes provided to the quantum well layer spatially overlap with each other, such that a coupling rate of the electrons and the holes is increased, thus the light-emission efficiency of the light-emitting device is improved.

Figure 5:
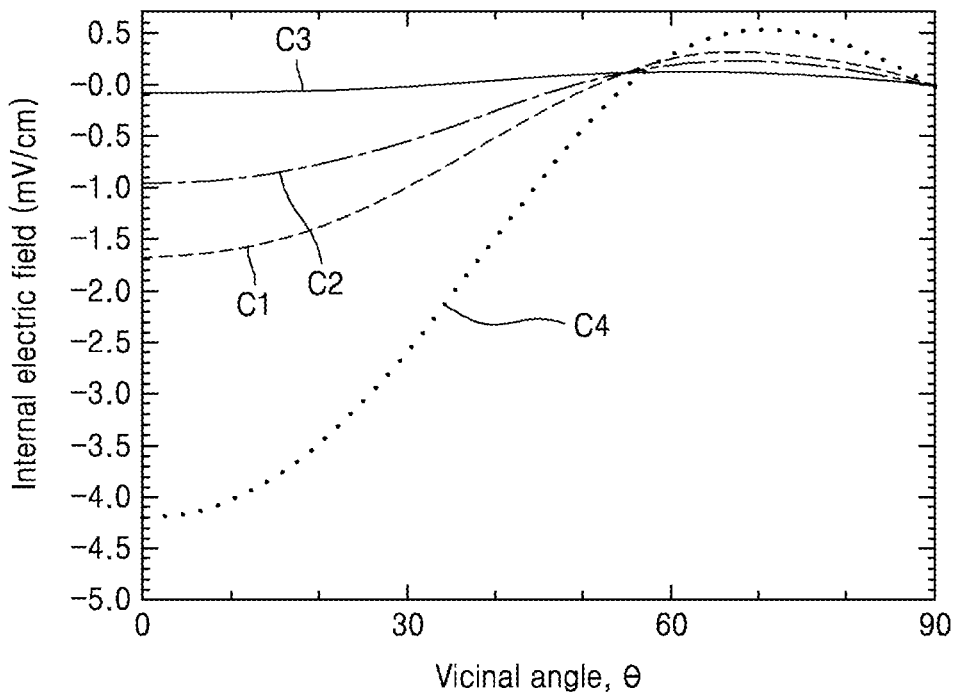
FIG. 5 is a graph showing a calculation result of a change in an internal electric field with respect to a miscut angle of a light-emitting structure having an AlInGaN/InGaN quantum well structure, according to an example embodiment.

FIG. 5 is a graph illustrating a calculation result of a change in an internal electric field with respect to a miscut angle (that is, the first angle) of a light-emitting structure having an AlInGaN/InGaN quantum well structure according to an example embodiment. In the example embodiment, the quantum well structure was $Al_{0.13}In_{0.37}Ga_{0.5}N/In_zGa_{1-z}N$ and the thickness of the AlInGaN quantum well layer was about 3 nm. Curves C1 through C3 have z values of 0.2, 0.25, and 0.31, respectively. A curve C4 shows an internal electric field of a light-emitting device having a quantum well structure $In_{0.3}Ga_{0.7}N/GaN$ of the related art. In each case, an electric charge injection concentration was $10^{13}/cm^{-2}$.

It can be seen that an absolute value of an internal electric field of the curve C4 is substantially greater than the absolute values of internal electric fields of the curves C1 through C3. As the absolute value of the internal electric field increases, positions of electrons and holes become mismatched, degrading the efficiency of light emission.

On the other hand, in the curves C1-C3 according to an example embodiment, the absolute values of the internal electric fields decrease with respect to the absolute value of the internal electric field of C4. Thus, the light-emission efficiency of the light-emitting device according to an example embodiment is higher than the light-emission efficiency of a light-emitting device of the related art.

If the miscut angle is greater than 40°, emitted light may be beyond a green light range.

Figure 6:
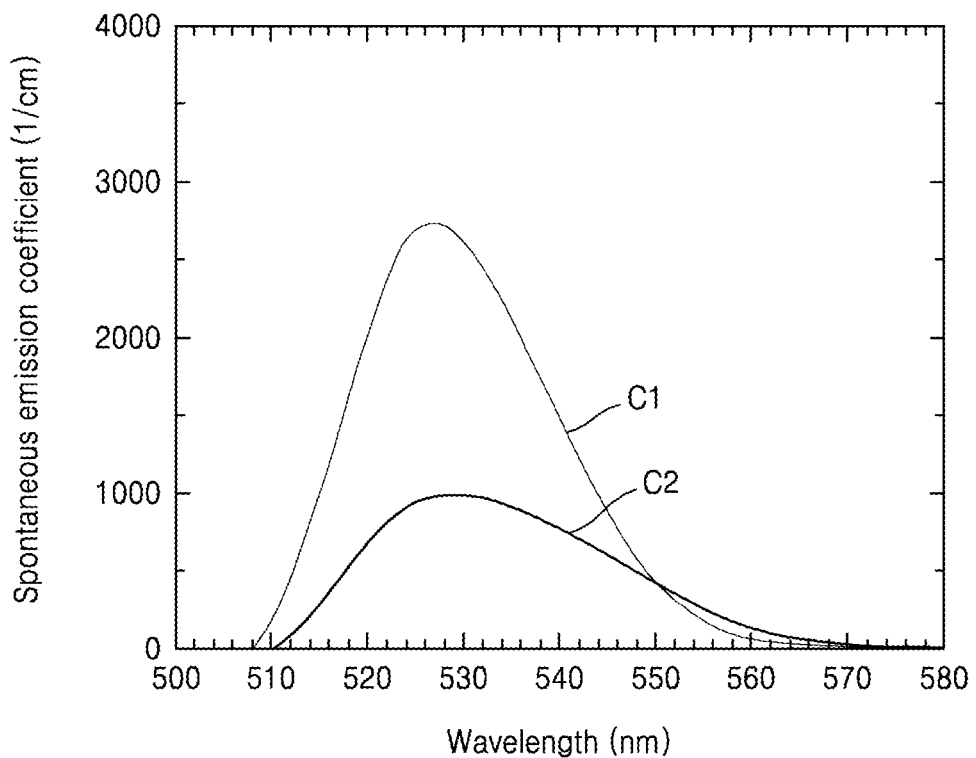
FIG. 6 is a graph showing a calculation result of a spontaneous emission coefficient of a light-emitting structure having an AlInGaN/InGaN quantum well structure, according to an example embodiment.

FIG. 6 is a graph illustrating a calculation result of a spontaneous emission coefficient of a light-emitting structure having an AlInGaN/InGaN quantum well structure, according to an example embodiment. In the example embodiment, the quantum well structure was Al0.13In0.37Ga0.5N/In0.27Ga0.73N and the thickness of the AlInGaN quantum well layer was about 3 nm.

In FIG. 6, a spontaneous emission coefficient of a light-emitting structure having an InGaN/GaN-based ternary quantum well structure of the related art is also shown. The quantum well structure of the related art was In0.3Ga0.7N/GaN and a miscut angle was about 20°. The curve C1 illustrates a spontaneous emission coefficient of a light-emitting device according to an example embodiment, and the curve C2 illustrates a spontaneous emission coefficient of a light-emitting device of the related art.

A miscut angle of each light-emitting device was about 20° and an electric charge injection concentration was about $10^{13}/cm^{-2}$.

As seen from FIG. 6, in comparison to the strength of spontaneous emission of green light around about a peak wavelength of about 530 nm, the strength of spontaneous emission of the light-emitting device, according to an example embodiment, is about 3 times greater than the strength of spontaneous emission of the light-emitting device of the related art. That is, in green-light emission, the light-emission efficiency of the light-emitting device, according to an example embodiment, is greater than the light-emission efficiency of the light-emitting device of the related art.

In the light-emitting device according to an example embodiment, the light-emitting layer including the AlInGaN/InGaN quantum well structure is grown on the miscut vicinal c-plane substrate and a composition of the light-emitting layer and the vicinal angle of the c-plane substrate are appropriately set, thereby improving the efficiency of green-light emission.

Moreover, a substrate having a vicinal c-plane obtained by miscutting a relatively low-price c-plane substrate is used in place of a typically costly non-polar substrate, and a large area light-emitting device may be fabricated.

It should be understood that the example embodiments described herein should be considered in a descriptive sense only and not for purposes of limitation. Descriptions of features within each example embodiment should typically be considered as available for other similar or the same features in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A light-emitting device comprising:
    a substrate having a vicinal c-plane surface;
    a light-emitting layer on the vicinal c-plane surface of the substrate; and
    wherein the light-emitting layer includes a quantum well layer of $Al_xIn_yGa_{1-x-y}N$ and at least one quantum barrier layers of $In_zGa_{1-z}N$ disposed at either side of the quantum well layer, and wherein $0 < x < 1$, $0 < y < 1$, and $0 < z < 1$,
    wherein x, y, and z have values for which an internal electric field of the light-emitting device is substantially equal to 0.

2. The light-emitting device of claim 1, wherein x is in a range of about 0.1 to about 0.4, y is in a range of about 0.3 to about 0.5, and z is in a range of about 0.25 to about 0.35.

3. The light-emitting device of claim 1, wherein the substrate is inclined at an angle in a range of about 10° to about 40° with respect to a c-axis.

4. The light-emitting device of claim 3, wherein the substrate comprises a silicon substrate.

5. The light-emitting device of claim 3, further comprising a green-light emitting device.

6. The light-emitting device of claim 1, wherein the substrate comprises at least one of sapphire, GaN, SiC, AlN or BN.

7. The light-emitting device of claim 1, wherein the light-emitting layer has one of a single quantum well structure and a multi-quantum well structure.

* * * * *